United States Patent
Sarig et al.

(10) Patent No.: US 11,025,212 B1
(45) Date of Patent: Jun. 1, 2021

(54) OPERATIONAL TRANSCONDUCTANCE AMPLIFIER AND A METHOD FOR CONVERTING A DIFFERENTIAL INPUT VOLTAGE TO A DIFFERENTIAL OUTPUT CURRENT

(71) Applicant: Tower Semiconductors Ltd., Migdal Haemek (IL)

(72) Inventors: Erez Sarig, Migdal Haemek (IL); Alon Blumenfeld, Migdal Haemek (IL); Danny Pollak, Migdal Haemek (IL)

( * ) Notice: Subject to any disclaimer, the term of this patent is extended or adjusted under 35 U.S.C. 154(b) by 0 days.

(21) Appl. No.: 16/721,919

(22) Filed: Dec. 20, 2019

(51) Int. Cl.
    *H03F 3/45* (2006.01)

(52) U.S. Cl.
    CPC .............. *H03F 3/45219* (2013.01); *H03F 2203/45114* (2013.01)

(58) Field of Classification Search
    CPC ................................................ H03F 3/4521
    See application file for complete search history.

(56) References Cited

U.S. PATENT DOCUMENTS

| | | | |
|---|---|---|---|
| 7,030,697 B1* | 4/2006 | Pribytko | H03F 3/45192 330/257 |
| 9,698,770 B1* | 7/2017 | Menezes | H03K 17/223 |
| 10,193,507 B1* | 1/2019 | Avci | H03G 1/0029 |
| 2009/0009249 A1* | 1/2009 | Gilbert | H03F 3/45089 330/260 |
| 2009/0195313 A1* | 8/2009 | Muller | H03F 3/45197 330/261 |
| 2011/0080218 A1* | 4/2011 | Zuffada | H03H 11/0422 330/278 |

* cited by examiner

*Primary Examiner* — Patricia T Nguyen
(74) *Attorney, Agent, or Firm* — Reches Patent

(57) ABSTRACT

An operational transconductance amplifier, that may include a first differential pair that comprises a first transistor and a second transistor that are coupled to each other at a certain node; wherein the first differential pair is configured to convert a differential input voltage to first and second output currents; a current source that is coupled to the certain node and may include an adjustable current sources; and a feedback unit that is coupled to the certain node and is configured to (a) receive the differential input voltage, and maintain a voltage of the certain node substantially fixed regardless of changes in the differential input voltage.

20 Claims, 4 Drawing Sheets

OPERATIONAL TRANSCONDUCTANCE AMPLIFIER AND A METHOD FOR CONVERTING A DIFFERENTIAL INPUT VOLTAGE TO A DIFFERENTIAL OUTPUT CURRENT

BACKGROUND OF THE INVENTION

Operational amplifier that require a responds to large input signals usually use some slew rate boosting techniques. Most operational amplifiers uses a differential input stage constructed with an input pair transistors and a tail current. The current of a differential input stages is defined by its tail current. In the event of a step response, the maximum current the differential pair can drive is limited by the tail current. Common methods to mitigate this challenge is known as current boosting or slew rate enhancement. There are many different slew rate boosting techniques. In general they are divided in to two groups.

Techniques which enhance the output driving current (such as class AB output stage) and ones which boost the input differential pair tail current. Most of the techniques to boost tail current are based on a feedback current branches or voltage nodes further along the signal path of the amplifier. Such techniques defines the amplifier architecture.

SUMMARY

According to an embodiment of the invention there may be provided an operational transconductance amplifier and a method.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
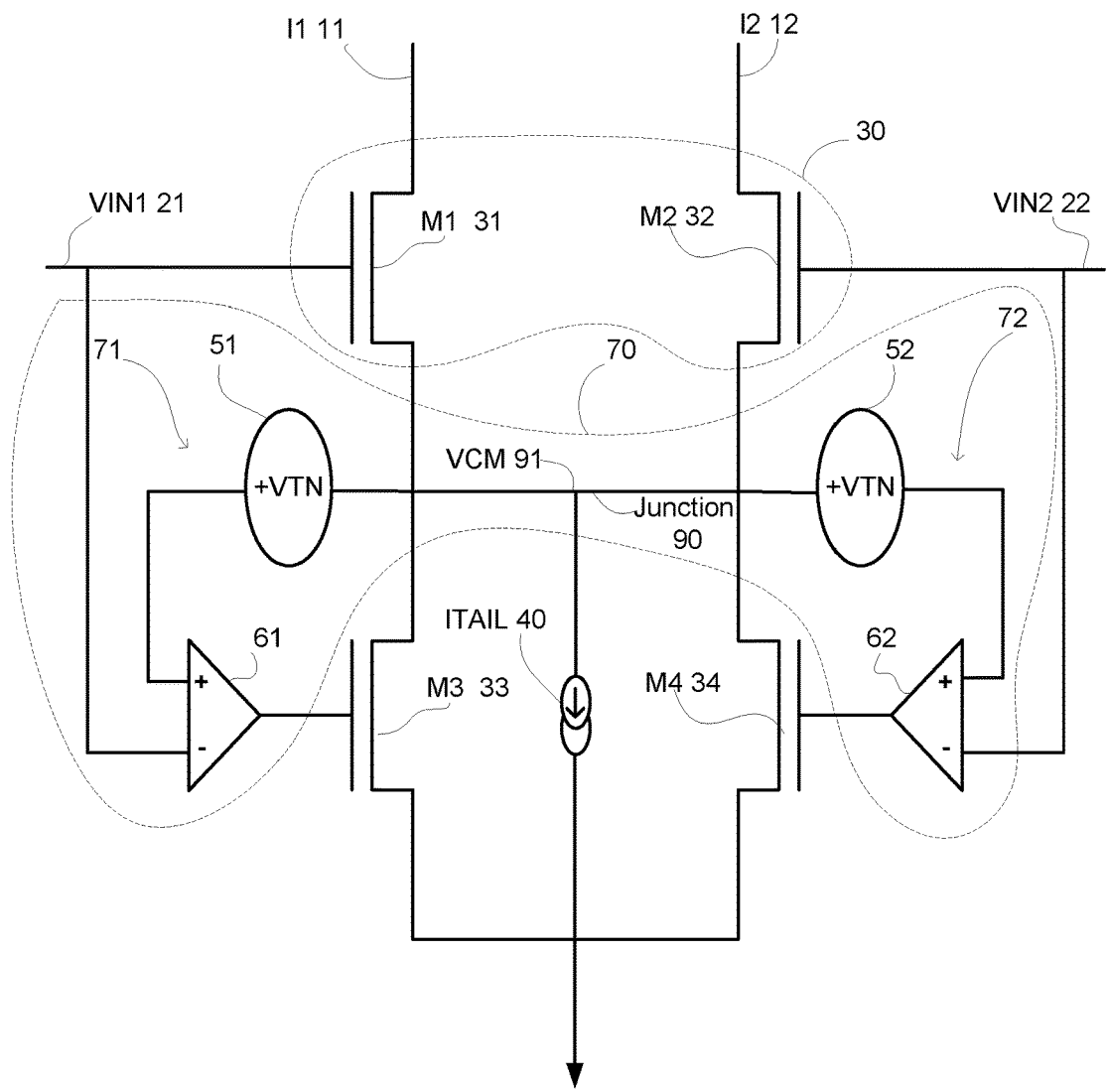
FIG. 1 is example of an operational transconductance amplifier.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

FIG. 1 illustrates an example of operational transconductance amplifier 10.

The operational transconductance amplifier is configured to drive large current with respect to its input voltage and it may be limited only by the dimensions of the differential input pair.

The suggested operational transconductance amplifier may provide a simple input stage architecture which is insensitive to the type of load it drives or the amplifier architecture. In addition, the operational transconductance amplifier doesn't interfere a differential pair operation, doesn't change its characteristics (including voltage swing, noise or offset).

The operational transconductance amplifier 10 may include:

A differential input pair 30 that includes a first transistor (M1 31) and a second transistor (M2 32) that are coupled to each other at a certain node (at node 90) together with a current tail (40). The differential input pair is configured to convert a differential input voltage (which equals the difference between first input voltage VIN1 21 and second input voltage VIN2 22) to a first output current I1 11 and a second output current I2 12.

A current source that is coupled to the certain node and may include a fixed tail current source (ITAIL 40) and adjustable current sources (third transistor M3 33 and fourth transistor M4 34). The combination of the fixed tail current from the fixed current source and the currents outputted from the adjustable current sources is a boosted tail current which is driven to the output current (I1 11 I2 12) according to the input voltages.

In contrary to a common differential pair (in which the maximum output current in either of the current outputs is limited to the fixed current tail current)—the suggested operational transconductance amplifier provides a much higher output current.

Feedback unit (70) that is coupled to the certain node and is configured to (a) receive the differential input voltage, (b) maintain a voltage (VCM 91) of the certain node 90 substantially fixed regardless of changes in the differential input voltage, and (c) control the adjustable current sources (third transistor M3 33 and fourth transistor M4 34) based on the differential input voltage.

The feedback unit 70 may include first feedback sub-unit 71 and second feedback sub-unit 72.

First feedback sub-unit 71 is configured to (a) receive a first input voltage (VIN1 21), and (b) control a first adjustable current source (M3 33) of the adjustable current sources, based on the first input voltage.

Second feedback sub-unit 72 is configured to (a) receive a second input voltage (VIN2 22), and (b) control a second adjustable current source (M4 34) of the adjustable current sources, based on the second input voltage.

First feedback sub-unit 71 is configured to maintain the voltage (VCM 91) of the certain node substantially fixed regardless of an increase in the second input voltage (VIN2 22).

Second feedback sub-unit 72 is configured to maintain the voltage (VCM 91) of the certain node substantially fixed regardless of an increase in the first input voltage (VIN1 21).

Each one of the first feedback sub-unit and the second feedback sub-unit could be comprises a folded cascode amplifier.

FIG. 1 illustrates the first feedback sub-unit 71 as including a first amplifier 61 and a first voltage source 51 that virtually adds a threshold voltage Vth to VCM 91 (voltage of node 90). The first voltage source is coupled to a non-inventing input of the first amplifier 61. An inverting input of the first amplifier is fed by the first input voltage VIN1 21.

FIG. 1 illustrates the second feedback sub-unit 72 as including second amplifier 62 and a second voltage source 52 that virtually adds a threshold voltage Vth the VCM 91 of node 90. The second voltage source 52 is coupled to a non-inventing input of the second amplifier 62. An inverting input of the second amplifier 62 is fed by the second input voltage VIN2 22.

The first and second amplifiers (61 and 62) are configured to detect changes in the first and second input voltages (minus Vth) in reference to the VCM 91 (of node 90).

When one of the first and second input voltages drops below (VCM 91+VTN) the corresponding amplifier drives its output high turning on the respective adjustable current source out of third and fourth transistors (M3 33 or M4 34) so as to driver additional tail current to the outputs of M1 31 or M2 32 (for outputting first output current I1 and second output current, I2).

The selective operation of the adjustable current sources creates a low impedance on node 90 enabling first and second transistors M1 31 and M2 32 to behave as a common source NMOS with no limit current. This allows a user to connect any load to the terminal over which the first and second output currents (I1 and I2) are supplied.

Figure 2:
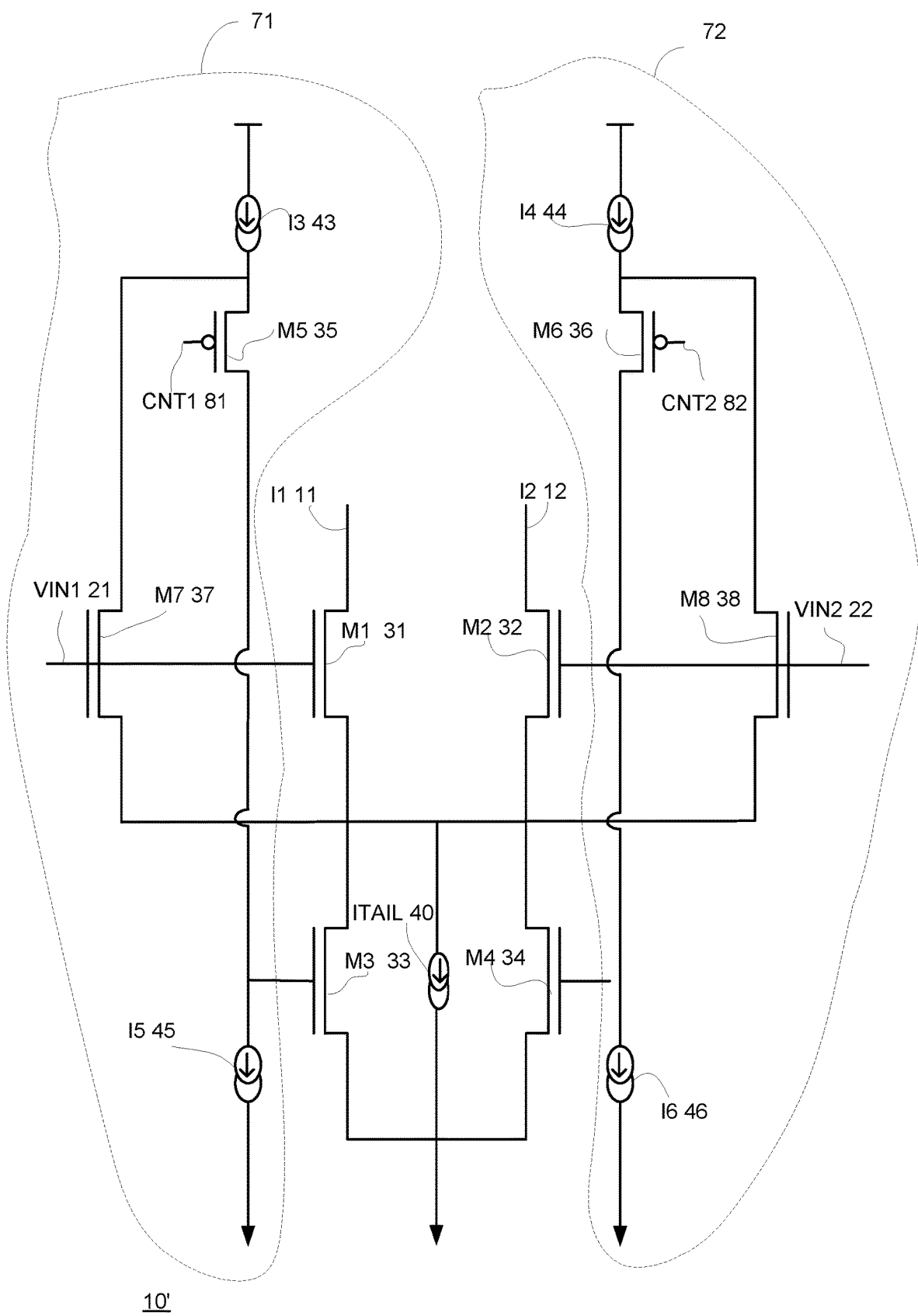
FIG. 2 is example of an operational transconductance amplifier.

FIG. 2 illustrates an example of operational transconductance amplifier 10'.

The first feedback sub-unit 71 includes seventh transistor M7 37 and serially coupled elements that include (a) first additional fixed current source I3 43, (b) fifth transistor M5 35. and (c) second additional fixed current source I5 45.

The gates of the seventh transistor M7 37 and the first transistor M1 31 receive the first input voltage VIN1 21.

Fifth transistor M5 35 and eighth transistor M8 38 may act as cascode stages.

The second feedback sub-unit 72 includes eighth transistor M8 38 and serially coupled elements that include (a) third additional fixed current source I4 44, (b) sixth transistor M6 36, and (c) fourth additional fixed current source I6 46.

The gates of the eighth transistor M8 38 and the second transistor M2 32 receive the second input voltage VIN2 22.

Seventh transistor M7 37 and eighth transistor M8 38 are in a folded cascade connection which allows the wide input swing option. With this architecture, each one of the first and second input voltages can swing between VTH+VDS (drain source voltage) as in a standard differential N-type pair to as high as VDD−VDS (VDD being the voltage supply). To decrease offset and noise of this topology the value of the tail current can be adjust to place the amplifiers at saturation level up to certain differential input level.

This method and device allows to be used in any amplifier design that requires a differential input stage.

The suggested operational transconductance amplifier improves the driving capability of the differential pair with no effect to its other parameters such as input voltages, noise and offset. This concept can be implemented also for a PMOS type differential pair.

Figure 3:
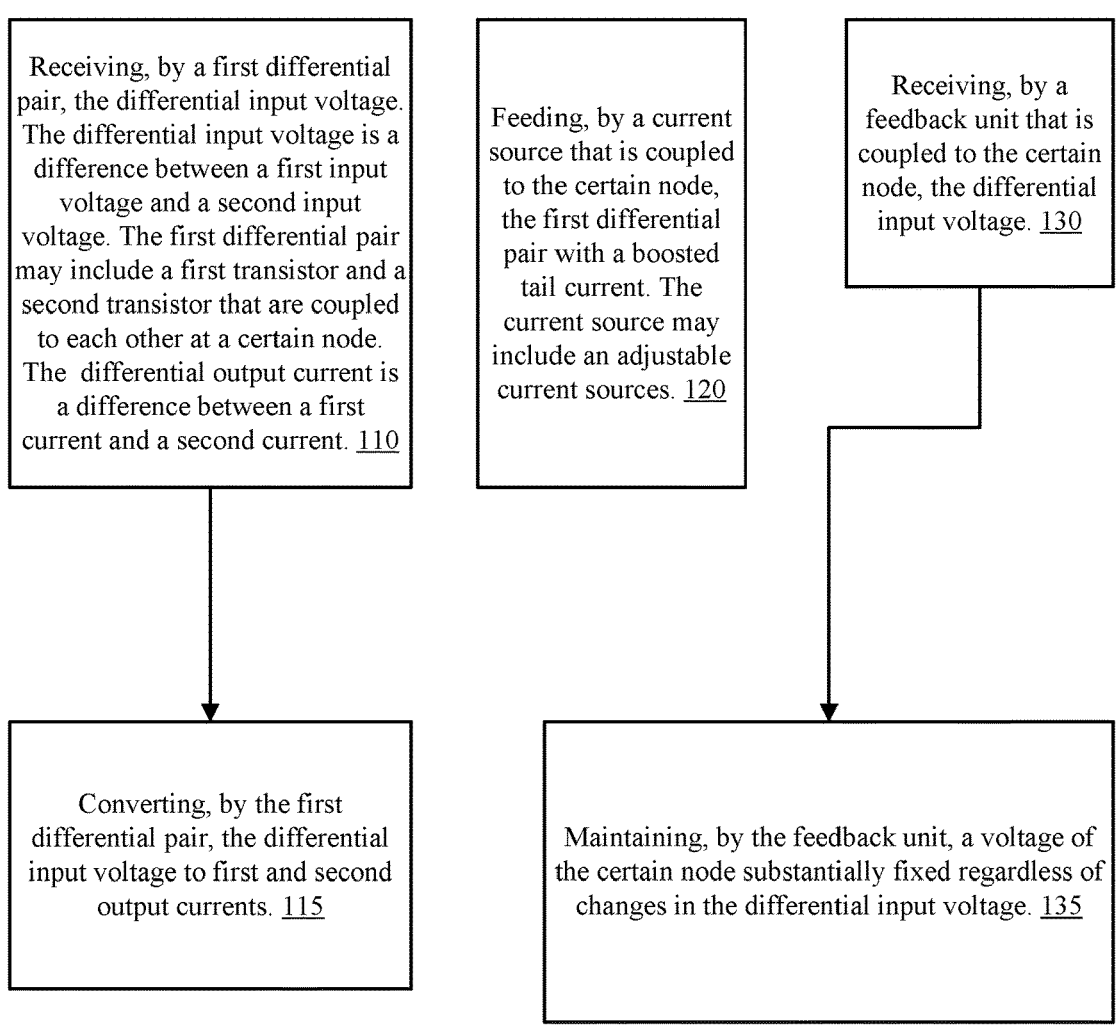
FIG. 3 is example of a method.

FIG. 3 is an example of method 100.

Method 100 is for converting a differential input voltage to an amplifier tail current.

Method 100 may start by steps 110, 120 and 130.

Step 110 may include receiving, by a first differential pair, the differential input voltage. The differential input voltage is a difference between a first input voltage and a second input voltage. The first differential pair may include a first transistor and a second transistor that are coupled to each other at a certain node.

Step 110 may be followed by step 115 of converting, by the first differential pair, the differential input voltage to two output currents.

Step 120 may include feeding, by a current source that is coupled to the certain node, the first differential pair with a boosted tail current. The current source may include an adjustable current sources and may include a fixed tail current source. The boosted tail current is a sum of currents outputted by the first tail current source and the adjustable current sources.

Step 130 may include receiving, by a feedback unit that is coupled to the certain node, the differential input voltage.

Step 130 may be followed by step 135.

Step 135 may include maintaining, by the feedback unit, a voltage of the certain node substantially fixed regardless of changes in the differential input voltage. This may be achieved by controlling, by the feedback unit, the adjustable current sources based on the differential input voltage.

The feedback unit may include a first feedback sub-unit and a second feedback sub-unit.

Step 130 may include receiving, by the first feedback sub-unit, the first input voltage, and receiving, by the second feedback sub-unit, the second input voltage.

Step 135 may include at least one of the following:

a. Controlling, by the first feedback sub-unit, a first adjustable current source of the adjustable current sources, based on the first input voltage.

b. Controlling, by the second feedback sub-unit, a second adjustable current source of the adjustable current sources, based on the second input voltage.

c. Maintaining, by the first feedback sub-unit, the voltage of the certain node substantially fixed regardless of an increase in the second input voltage.

d. Maintaining, by the second feedback sub-unit, the voltage of the certain node substantially fixed regardless of an increase in the first input voltage.

Each one of the first feedback sub-unit and the second feedback sub-unit may include a folded cascode amplifier or any other eligible amplifier.

Figure 4:
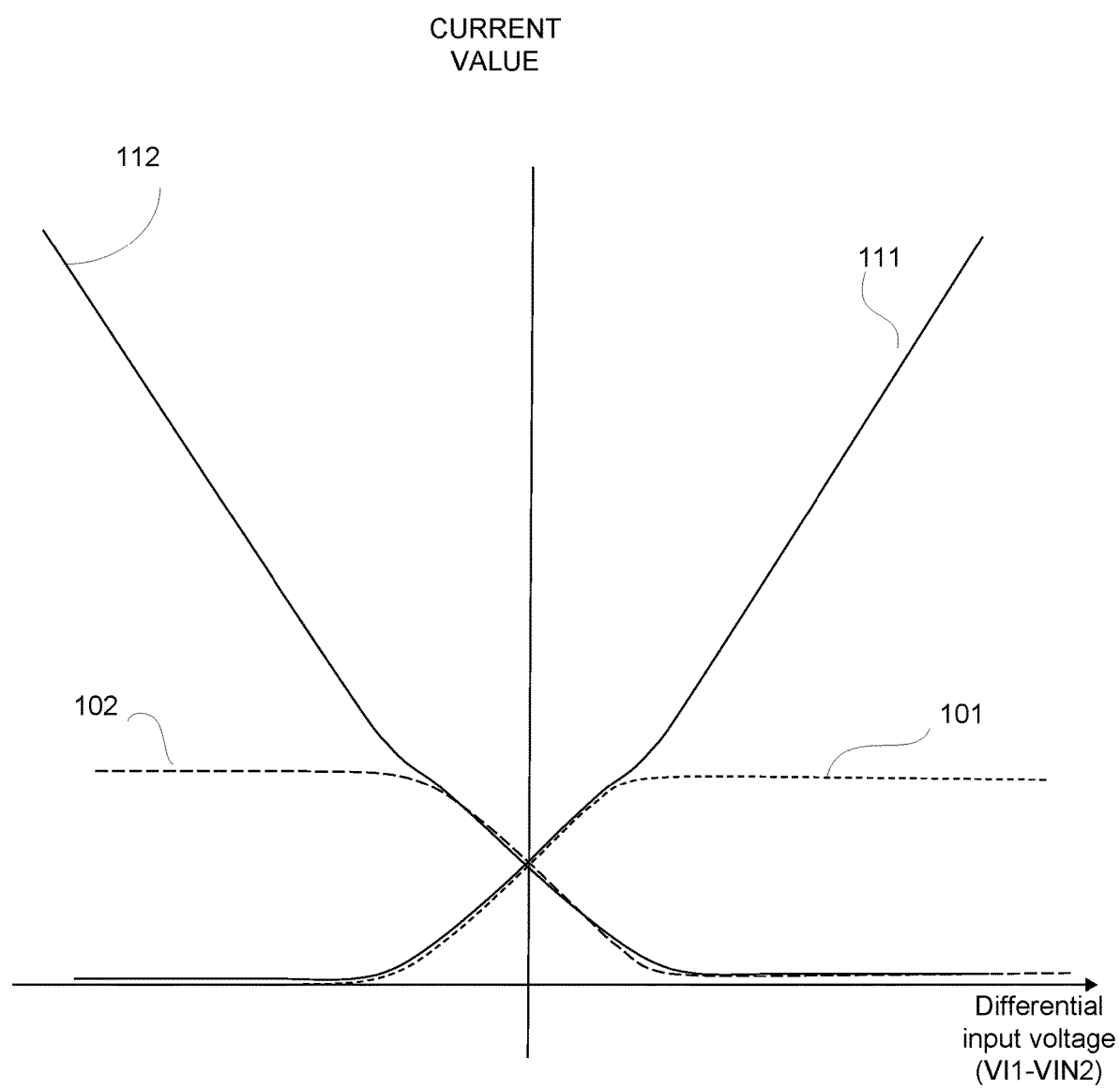
FIG. 4 is an example of a comparison of relationships between differential input voltage and tail current.

FIG. 4 is an example of a comparison of relationships between differential input voltage and output currents I1 and I2.

Curves 201 and 202 represent the relationship between I1 and I2 (respectively) and the input differential voltage of a prior art circuit.

Curves 211 and 212 represent the relationship between I1 and I2 (respectively) and the input differential voltage of the operational transconductance amplifier of FIGS. 1-2.

Any reference to any of the terms "comprise", "comprises", "comprising" "including", "may include" and "includes" may be applied to any of the terms "consists", "consisting", "consisting essentially of". For example—any of the rectifying circuits meaning illustrated in any figure may include more components that those illustrated in the figure, only the components illustrated in the figure or substantially only the components illustrated in the figure.

In the foregoing specification, the invention has been described with reference to specific examples of embodiments of the invention. It will, however, be evident that various modifications and changes may be made therein without departing from the broader spirit and scope of the invention as set forth in the appended claims. Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. An operational transconductance amplifier with a boosted tail current, comprising:
    a first differential pair that comprises a first transistor and a second transistor that are coupled to each other at a certain node; wherein the first differential pair is configured to convert a differential input voltage to a first output current and a second output current;
    a current source that is coupled to the certain node and comprises an adjustable current sources; wherein the current source is configured to output a boosted tail current;
    a feedback unit that is coupled to the certain node and is configured to (a) receive the differential input voltage, and (b) maintain a voltage of the certain node substantially fixed regardless of changes in the differential input voltage.

2. The operational transconductance amplifier according to claim 1, wherein a maximal value of a sum of the first and second output currents is defined by a dimensions of the first differential pair and the differential input voltages.

3. The operational transconductance amplifier according to claim 1, wherein the feedback unit is configured to maintain the voltage of the certain node substantially fixed by controlling the adjustable current sources based on a higher valued input voltage out of of the first and second input voltages.

4. The operational transconductance amplifier according to claim 1, wherein the feedback unit is configured to maintain the voltage of the certain node substantially fixed by controlling the adjustable current sources based on the differential input voltage.

5. The operational transconductance amplifier according to claim 1 wherein the feedback unit comprises a first feedback sub-unit and a second feedback sub-unit; wherein the first feedback sub-unit is configured to (a) receive the first input voltage, and (b) control a first adjustable current source of the adjustable current sources, based on the first input voltage.

6. The operational transconductance amplifier according to claim 5, wherein the second feedback sub-unit is configured to (a) receive the second input voltage, and (b) control a second adjustable current source of the adjustable current sources, based on the second input voltage.

7. The operational transconductance amplifier according to claim 6, wherein the first feedback sub-unit is configured to maintain the voltage of the certain node substantially fixed regardless of an increase in the second input voltage.

8. The operational transconductance amplifier according to claim 6, wherein the second feedback sub-unit is configured to maintain the voltage of the certain node substantially fixed regardless of an increase in the first input voltage.

9. The operational transconductance amplifier according to claim 6, wherein each one of the first feedback sub-unit and the second feedback sub-unit comprises a folded cascode amplifier.

10. The operational transamplifier according to claim 1 wherein a sum of the first and second output currents substantially equals the boosted tail current.

11. A method for converting a differential input voltage to a first and second output currents, the method comprises:
receiving, by a first differential pair, the differential input voltage; wherein the differential input voltage is a difference between a first input voltage and a second input voltage;
converting, by the first differential pair, the differential input voltage to the first and second output currents; wherein the first differential pair comprises a first transistor and a second transistor that are coupled to each other at a certain node; wherein the tail current includes the first current and the second current;
feeding, by a current source that is coupled to the certain node, the first differential pair with a boosted tail current; wherein the boosted tail current is a sum of current outputted by the adjustable current sources;
receiving, by a feedback unit that is coupled to the certain node, the differential input voltage; and
maintaining, by the feedback unit, a voltage of the certain node substantially fixed regardless of changes in the differential input voltage.

12. The method according to claim 11 wherein a maximal value of the first and second output currents is defined by a dimensions of the first differential pair.

13. The method according to claim 11, comprising maintaining the voltage of the certain node substantially fixed by controlling the adjustable current sources based on a higher valued input voltage out of the first and second input voltages.

14. The method according to claim 11, wherein the maintaining of the voltage of the certain node comprises controlling, by the feedback unit, the adjustable current sources based on the differential input voltage.

15. The method according to claim 14, wherein the feedback unit comprises a first feedback sub-unit and a second feedback sub-unit; wherein the method further comprises: receiving, by the first feedback sub-unit, the first input voltage; and controlling, by the first feedback sub-unit, a first adjustable current source of the adjustable current sources, based on the first input voltage.

16. The method according to claim 15, comprising receiving, by the second feedback sub-unit, the second input voltage; and controlling, by the second feedback sub-unit, a second adjustable current source of the adjustable current sources, based on the second input voltage.

17. The method according to claim 16, comprising maintaining, by the first feedback sub-unit, the voltage of the certain node substantially fixed regardless of an increase in the second input voltage.

18. The method according to claim 16, comprising maintaining, by the second feedback sub-unit, the voltage of the certain node substantially fixed regardless of an increase in the first input voltage.

19. The method according to claim 16, wherein each one of the first feedback sub-unit and the second feedback sub-unit comprises a folded cascode amplifier.

20. The method according to claim 11 wherein a sum of the first and second output currents substantially equals the boosted tail current.

\* \* \* \* \*

UNITED STATES PATENT AND TRADEMARK OFFICE
CERTIFICATE OF CORRECTION

| | | |
|---|---|---|
| PATENT NO. | : 11,025,212 B1 | Page 1 of 1 |
| APPLICATION NO. | : 16/721919 | |
| DATED | : June 1, 2021 | |
| INVENTOR(S) | : Sarig et al. | |

It is certified that error appears in the above-identified patent and that said Letters Patent is hereby corrected as shown below:

On the Title Page

Add item (73), Tower Semiconductor Ltd., Migdal Haemek, (IL)

Signed and Sealed this
Thirtieth Day of November, 2021

Drew Hirshfeld
*Performing the Functions and Duties of the*
*Under Secretary of Commerce for Intellectual Property and*
*Director of the United States Patent and Trademark Office*